United States Patent
Kinoshita

(10) Patent No.: US 7,329,938 B2
(45) Date of Patent: Feb. 12, 2008

(54) SEMICONDUCTOR INTEGRATED CIRCUIT

(75) Inventor: Koichi Kinoshita, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 237 days.

(21) Appl. No.: 10/845,247

(22) Filed: May 14, 2004

(65) Prior Publication Data

US 2005/0156200 A1  Jul. 21, 2005

(30) Foreign Application Priority Data

Jan. 13, 2004  (JP)  ............................ P2004-005978

(51) Int. Cl.
*H01L 29/00* (2006.01)
(52) U.S. Cl. ...................................... 257/512; 257/513
(58) Field of Classification Search ................ 257/512, 257/513
See application file for complete search history.

(56) References Cited

U.S. PATENT DOCUMENTS

2004/0031995 A1*  2/2004  Maeno et al. ................ 257/390

FOREIGN PATENT DOCUMENTS

JP  7-249747  9/1995

* cited by examiner

*Primary Examiner*—Kiesha L. Rose
(74) *Attorney, Agent, or Firm*—Oblon, Spivak, McClelland, Maier & Neustadt, P.C.

(57) ABSTRACT

A semiconductor integrated circuit includes a first cell spanning one of the p-wells and one of the n-wells adjacent to each other, and having one end on a dividing line inside the p-well and another end on a dividing line inside the n-well, and having a height determined by the one end and the another end; and a second cell, spanning another one of the p-wells and another one of the n-wells adjacent to each other, with a height covering the entire widths of the p- and n-wells measured along the column direction, the height of the second cell is double that of the first cell.

12 Claims, 16 Drawing Sheets

SEMICONDUCTOR INTEGRATED CIRCUIT

CROSS REFERENCE TO RELATED APPLICATIONS

This application is based upon and claims the benefit of priority from the prior Japanese Patent Applications No. P2004-5978, filed on Jan. 13, 2004; the entire contents of which are incorporated herein by reference.

BACKGROUND OF THE INVENTION

1. Field of the Invention

The present invention relates to a semiconductor integrated circuit, and particularly to a standard cell used for design of a semiconductor integrated circuit.

2. Description of the Related Art

A standard cell method is one of the semiconductor integrated circuit design methods (layout techniques) of forming a highly integrated semiconductor integrated circuit on a semiconductor substrate. The standard cell method is a method for designing a desired large-scale integration (LSI) chip in the following manner: functional circuits as basic units constituting circuits such as an inverter and a NAND element are designed and verified in advance by humans or computer as standard cells; and a metal wiring layer is formed thereto. In a earlier standard cell method, a space for placement of a large transistor cannot be assured since standard cells are orderly arranged. However, when a large transistor is needed, a space for placement of the transistor is provided by extending a cell in the channel length direction of the transistor, or by placing cells continuously in the channel width direction.

A "double-height cell" is a cell where two cells are placed continuously in the channel width direction, and a large area for placement of a transistor can be thus provided either in a p-well region or in an n-well region. A "triple-height cell" is a cell where three cells are placed continuously in the channel width direction, and a large area can therefore be provided in both-p-well and n-well regions.

However, although a large area for placement of a transistor can be provided in a p-well region and/or an n-well region with respect to the earlier double-height and triple-height cells, there are also divided p-well and n-well regions above and below the large area. The space for placement of a transistor in the divided p-well and n-well regions is as small as that of an ordinary cell. Therefore, the possible size of the transistor to be placed in such an area is limited.

SUMMARY OF THE INVENTION

An aspect of the present invention inheres in a semiconductor integrated circuit includes a plurality of standard cells implemented by p-wells and n-wells, extending along the row direction, the row of the p-wells and n-wells are arranged periodically and alternately along the column direction. The semiconductor integrated circuit includes a first cell spanning one of the p-wells and one of the n-wells adjacent to each other, and having one end on a dividing line inside the p-well and another end on a dividing line inside the n-well, and having a height determined by the one end and the another end and a second cell, spanning another one of the p-wells and another one of the n-wells adjacent to each other, with a height covering the entire widths of the p- and n-wells measured along the column direction, the height of the second cell is double that of the first cell.

Another aspect of the invention inheres in a design system for designing a semiconductor integrated circuit including a plurality of standard cells implemented by p-wells and n-wells, extending along the row direction, the row of the p-wells and n-wells are arranged periodically and alternately along the column direction. A cell data storage device configured to store data of function and size of a plurality of first cells, each spanning one of the p-wells and one of the n-wells adjacent to each other, and having one end on a dividing line inside the p-well and another end on a dividing line inside the n-well, and having a height determined by the one end and the another end and second cells, and a plurality of second cells, each spanning another one of the p-wells and another one of the n-wells adjacent to each other, with a height covering the entire widths of the p- and n-wells measured along the column direction, the height of the second cell is double that of the first cell. An automatic automatic routing module configured to read the first cells and the second cells having functional circuits from the cell data storage device, and placing the first and second cells and routing interconnections between the placed first and second cells. A second cell detection module configured to detect the second cells, and detecting a physically isolated second cell from the detected second cells. An inter-second-cell distancing measurement module configured to measure a distance between the isolated second cell and a second cell nearest to the isolated second cell, and to determine whether the measured distance is shorter than a defined inter-second-cell distance based on a design specification. A second cell combining module configured relocate the isolated second cell so as to combine the two second cells to be vertically adjacent to each other when the distance between the isolated second cell and the second cell nearest to the isolated second cell is shorter than the defined inter-second-cell distance.

Another aspect of the present invention inheres in a computer implemented method for designing a semiconductor integrated circuit includes a plurality of standard cells implemented by p-wells and n-wells, extending along the row direction, the row of the p-wells and n-wells are arranged periodically and alternately along the column direction, comprising, storing data to a cell date storage device on function and size of a plurality of first cells, each spanning one of the p-wells and one of the n-wells adjacent to each other, and having one end on a dividing line inside the p-well and another end on a dividing line inside the n-well, and having a height determined by the one end and the another end and second cells, and a plurality of second cells, each spanning another one of the p-wells and another one of the n-wells adjacent to each other, with a height covering the entire widths of the p- and n-wells measured along the column direction, the height of the second cell is double that of the first cell, reading the first cells and the second cells having functional circuits from the cell data storage device, and placing the first and the second cells and routing interconnections between the placed first and second cells, detecting the second cells, and detecting a physically isolated second cell from the detected second cells, measuring a distance between the isolated second cell and a second cell nearest to the isolated second cell, and to determine whether the measured distance is shorter than a defined inter-second-cell distance based on a design specification, and relocating the isolated second cell so as to combine the two second cells to be vertically adjacent to each other, when the distance between the isolated second cell and the second cell nearest to the isolated second cell is shorter than the defined inter-second-cell distance.

DETAILED DESCRIPTION OF THE INVENTION

Figure 1:
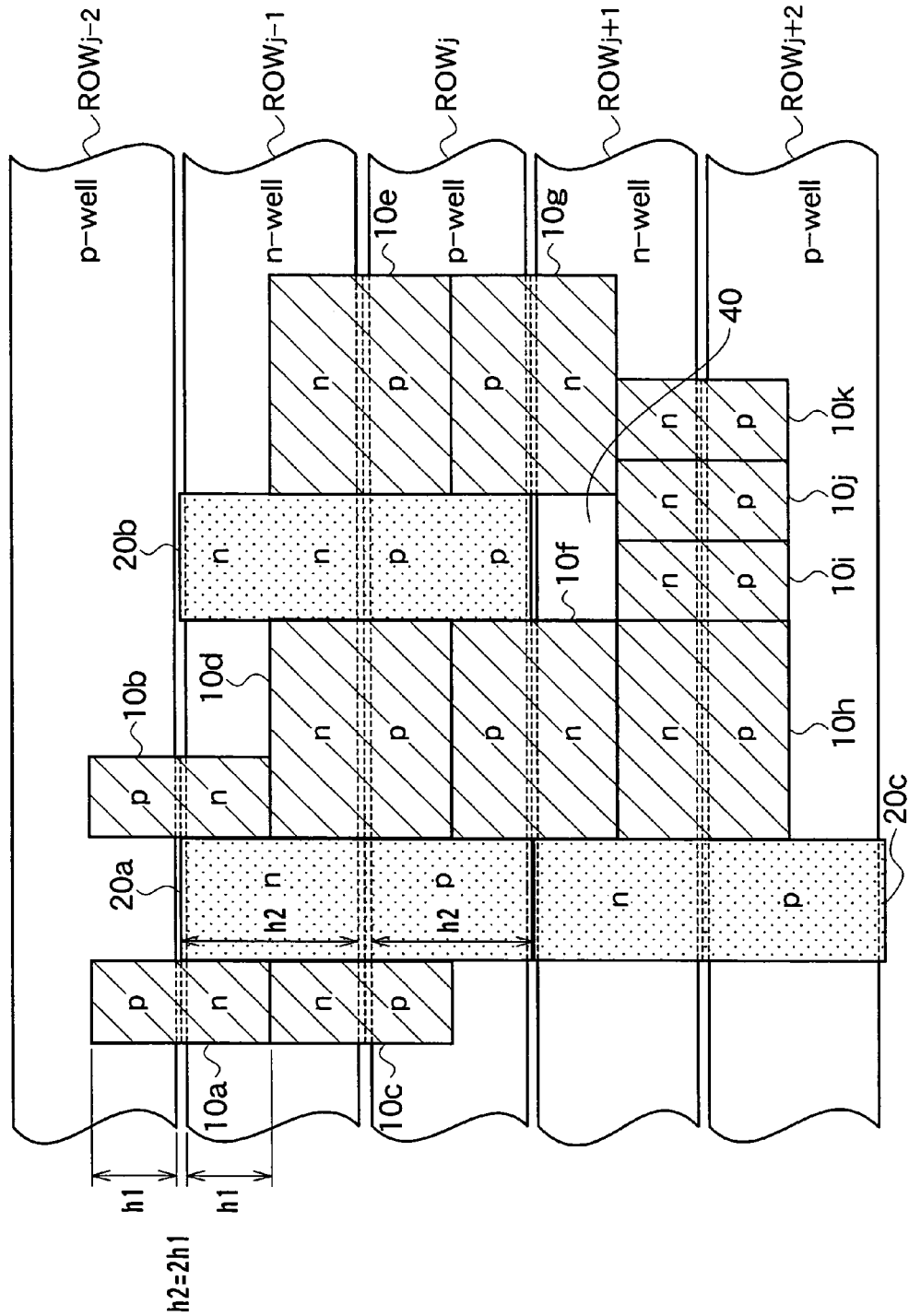
FIG. 1 is a plan view showing a semiconductor integrated circuit according to a first embodiment of the present invention.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified.

In the following descriptions, numerous specific details are set forth such as specific signal values, etc. to provide a thorough understanding of the present invention. However, it will be obvious to those skilled in the art that the present invention may be practiced without such specific details.

First Embodiment

Figure 2:
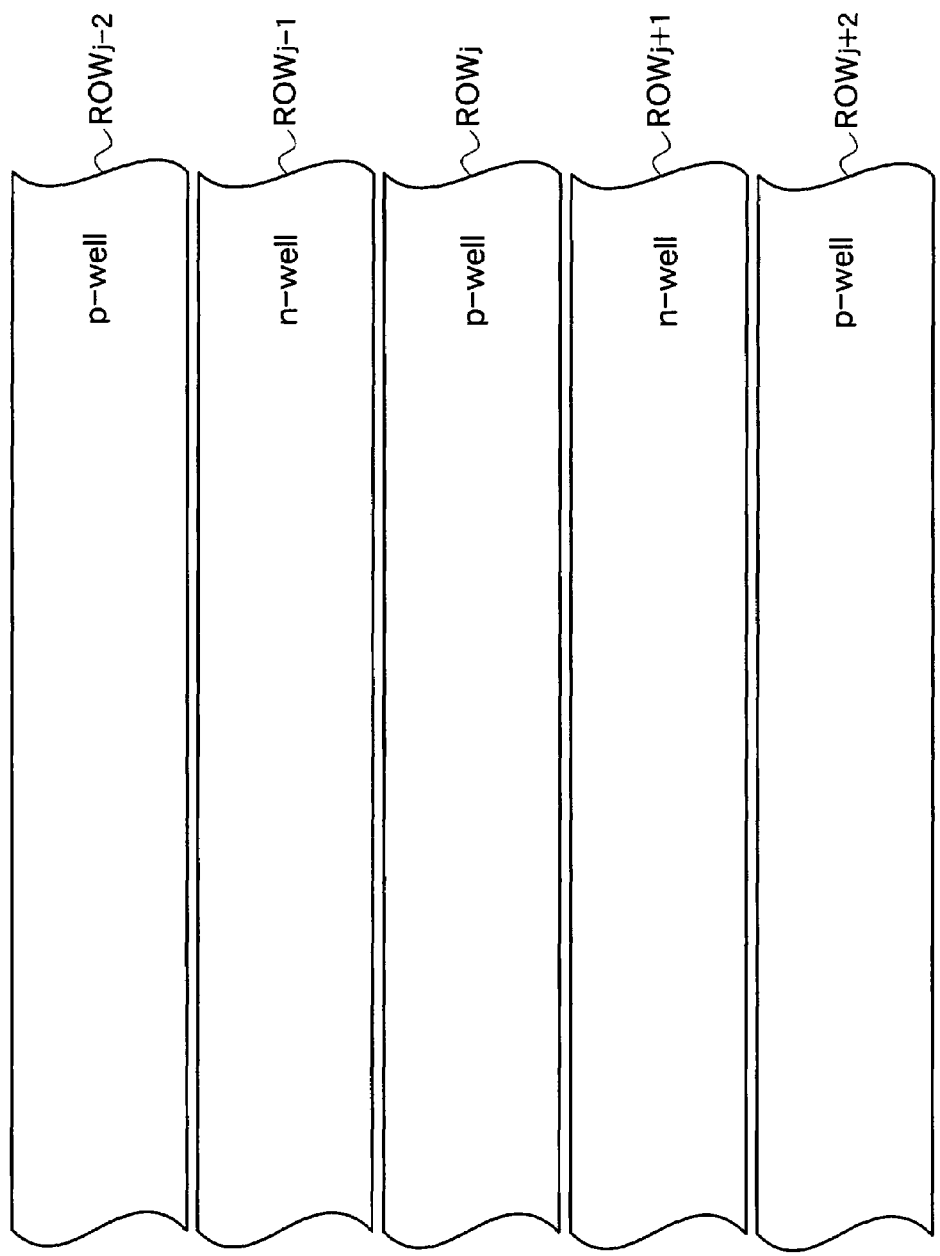
FIG. 2 is another plan view showing a semiconductor integrated circuit according to the first embodiment of the present invention.

In a semiconductor integrated circuit according to a first embodiment of the present invention, a plurality of standard cells are implemented by p-wells $ROW_{j-2}$, $ROW_j$ and $ROW_{j+2}$ as well as n-wells $ROW_{j-1}$ and $ROW_{j+1}$. The p-wells and n-wells are extended along the row direction. The rows of the p-wells $ROW_{j-2}$, $ROW_j$ and n-wells $ROW_{j-1}$ and $ROW_{j+1}$ are arranged periodically and alternately along the column direction as shown in FIG. 2. As shown in FIG. 1, first cells 10a to 10k and second cells (double-height cells) 20a to 20c are included in a standard cell configuration of the semiconductor integrated circuit according to the first embodiment. Each first cell spans one of the p-wells $ROW_{j-2}$, $ROW_j$ and $ROW_{j+2}$ and one of the n-wells $ROW_{j-1}$ and $ROW_{j+1}$ adjacent to each other, so as to have one end on a dividing line inside the p-well and another end on a dividing line inside one of the n-well, and having a height determined by the one end and the another end. Each second cell 20a to 20c spans another one of the p-wells $ROW_{j-2}$, $ROW_j$ and $ROW_{j+2}$ and the n-wells $ROW_{j-1}$ and $ROW_{j+1}$ adjacent to each other, with a height covering the entire widths of the p- and n-wells measured along the column direction, the height of the second cell 20a to 20c is double that of the first cells 10a to 10k.

Figure 3:
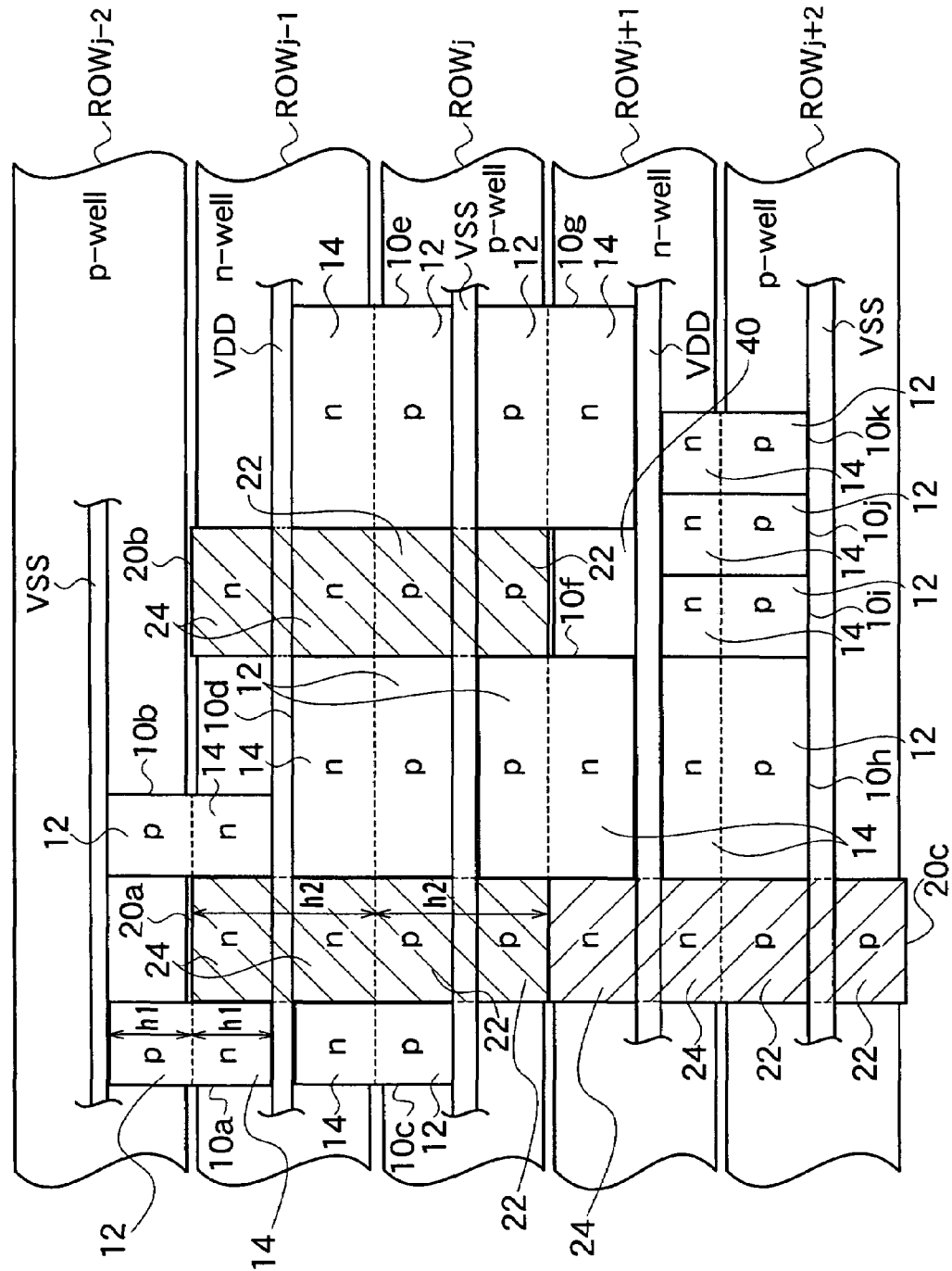
FIG. 3 is additional plan view showing a semiconductor integrated circuit according to the first embodiment of the present invention.

FIG. 3 shows an example of a layout delineating placement of high-level power supply wires VDD and low-level power supply wires VSS in the standard cell configuration of the semiconductor integrated circuit shown in FIG. 1. Regarding the high-level power supply wires VDD and the low-level power supply wires VSS, in the vicinity of the respective center lines of the p-wells $ROW_{j-2}$, $ROW_j$ and $ROW_{j+2}$ and the n-wells $ROW_{j-1}$ and $ROW_{j+1}$, the low-level power supply wires VSS and the high-level power supply wires VDD extend in the row direction, respectively, as shown in FIG. 3. Accordingly, the high-level power supply wires VDD and the low-level power supply wires VSS extend in the row direction in parallel to each other, and are positioned on the top and bottom cell borders of the first cells 10a to 10k. Moreover, the high-level power supply wires VDD and the low-level power supply wires VSS are crossing, in the row direction, the vicinity of the centers of intra-cell n regions 24 and intra-cell p regions 22 of the second cells 20a to 20c, respectively. The high-level power supply wires VDD and the low-level power supply wires VSS are made of a conductive material such as copper (Cu) and aluminum (Al), or of an aluminum alloy (Al—Si, Al—Cu—Si). A damascene wire may be used in the case of a Cu wire.

Figure 4:
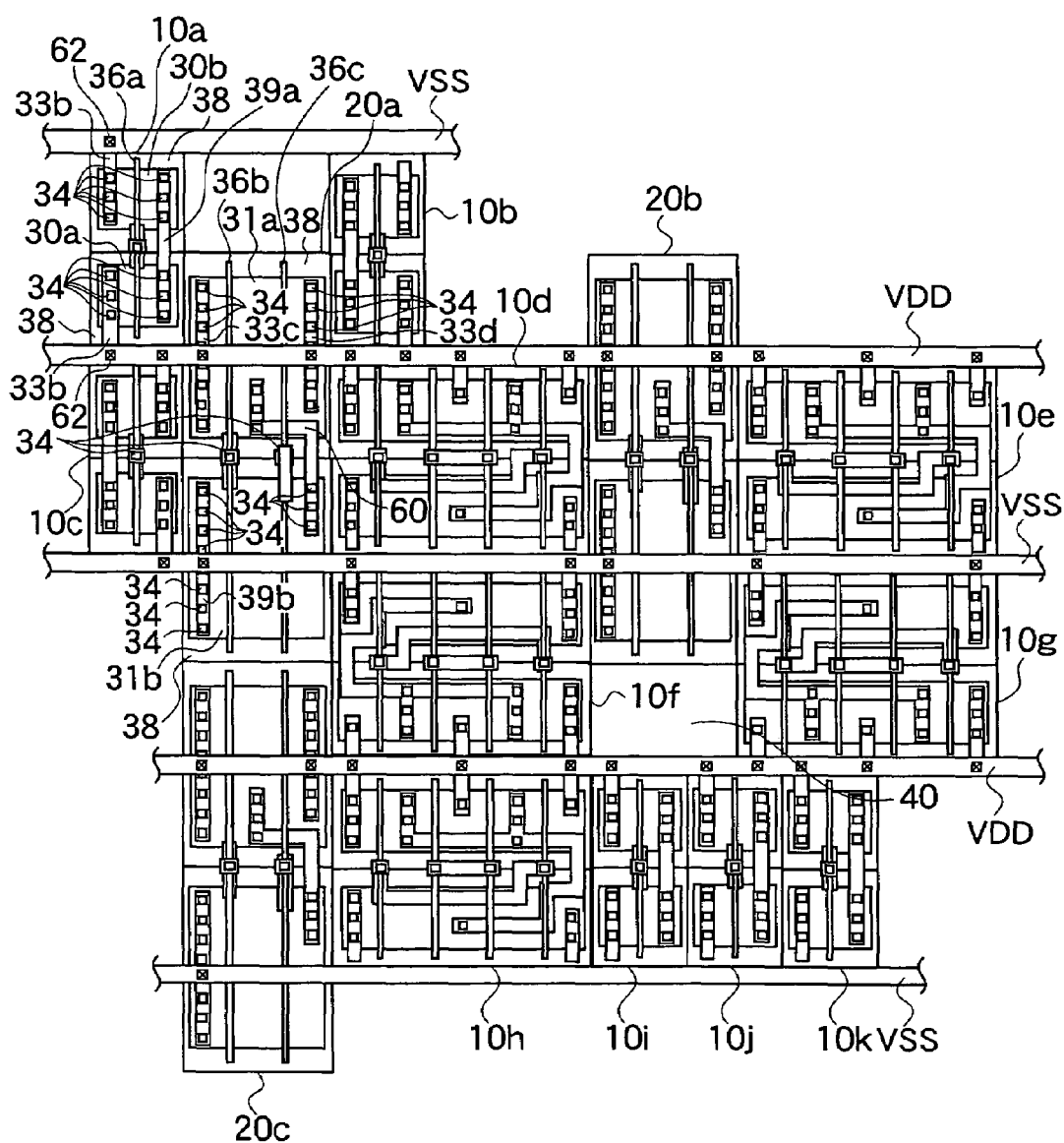
FIG. 4 is further plan view showing a semiconductor integrated circuit according to the first embodiment of the present invention.

In FIG. 3, the respective first cells 10a to 10k are constituted of an intra-cell p region 12 and an intra-cell n region 14 each of having a height h1, and the respective second cells 20a to 20c are constituted of an intra-cell p region 22 and an intra-cell n region 24 each of having a height h2. Accordingly, in the semiconductor integrated circuit of the first embodiment, the borders between the intra-cell p regions 12 and the intra-cell n regions 14 of the first cells 10a to 10k as well as the borders between the intra-cell p regions 22 and the intra-cell n regions 24 of the second cells 20a to 20c are both on the borders between the p-wells $ROW_{j-2}$, $ROW_j$ and $ROW_{j+2}$ and the n-wells $ROW_{j-1}$ and $ROW_{j+1}$. However, the positions of the ends of the first cells are different from those of the ends of the second cells by h1 in the column direction. Since the positions of the cell borders of the first cells 10a to 10k are different from the cell borders of the second cells 20a to 20c by h1 in the column direction, when any of the first cells 10a to 10k and any of the second cells 20a to 20c are placed in the same column, a filler 40 as shown in the vicinity of the center line of FIG. 3 is required. The filler 40 is provided in an empty space generated by a gap of heights between the first cells 10a to 10k and the second cells 20a to 20c. When of the filler 40 is needed, a spare cell, a capacitor, a diode, a sub-fixed cell or the like may be placed as the filler 40. As shown in FIG. 4, a plurality of elements are placed in each of the first cells 10a to 10k and the second cells 20a to 20c by forming local wires thereto.

Figure 5:
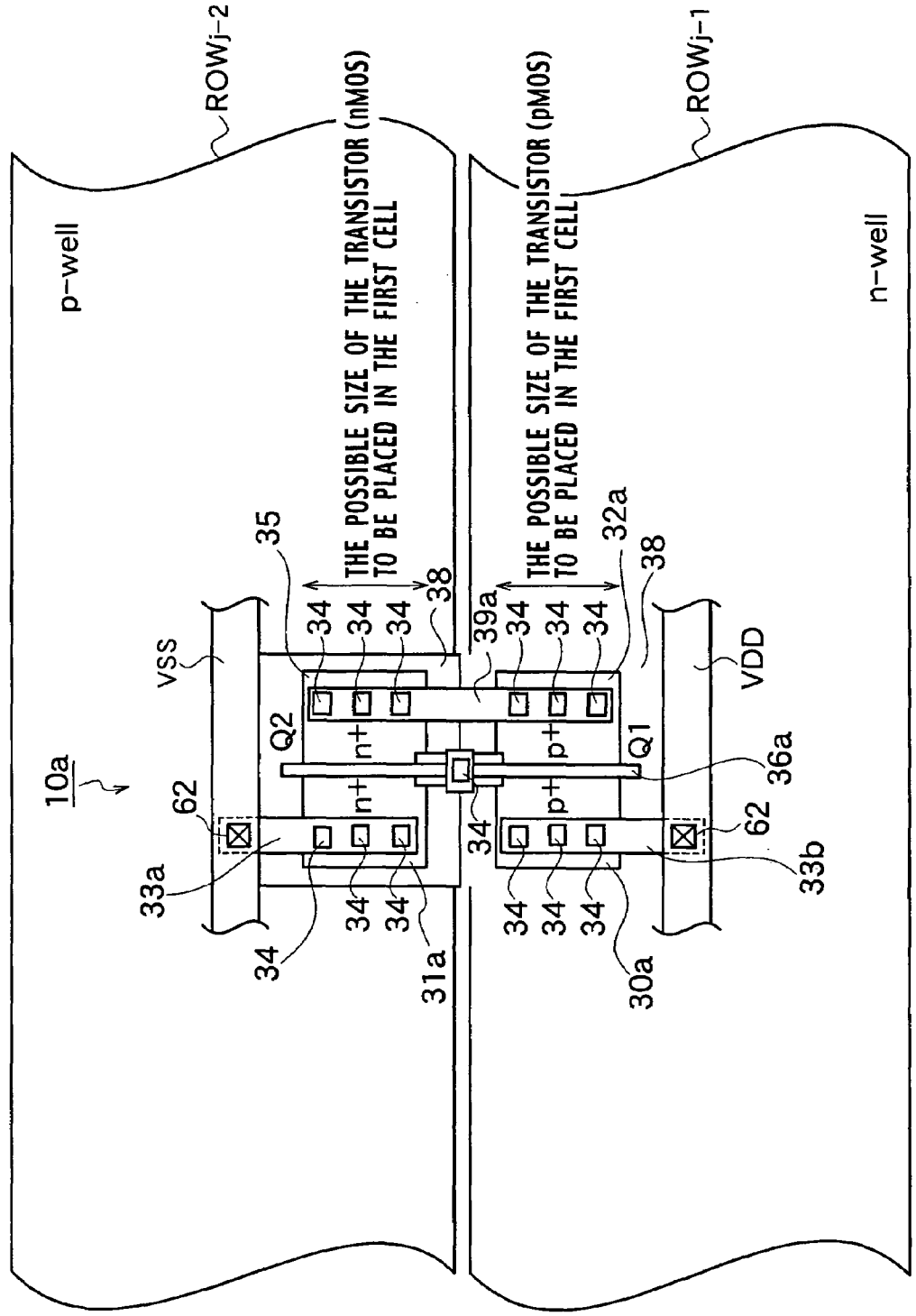
FIG. 5 is a plan view showing a first cell according to the first embodiment of the present invention.
Figure 6:
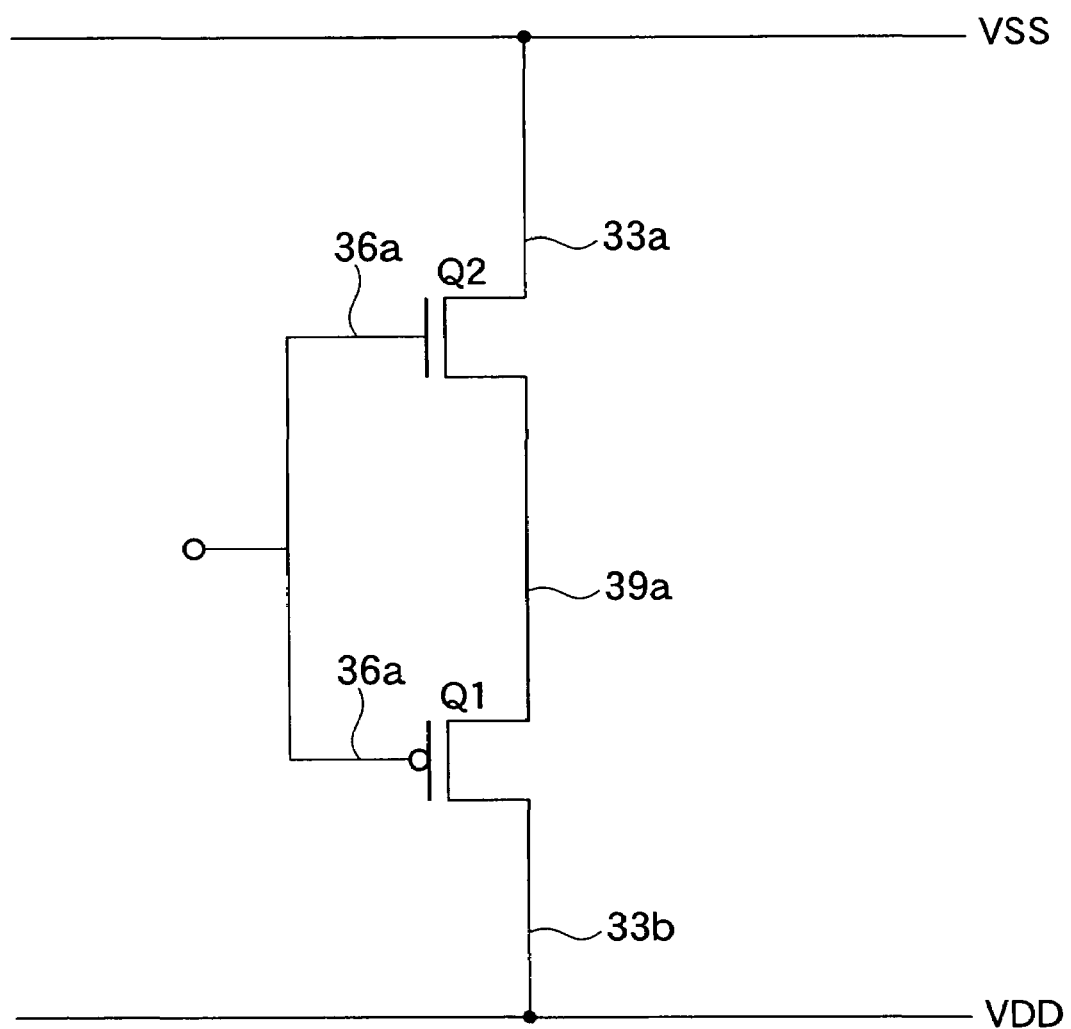
FIG. 6 is an equivalent circuit representing the first cell according to the first embodiment of the present invention.

FIG. 5 shows an example of a complementary metal oxide semiconductor (CMOS) inverter configured by forming local wires to the first cell 10a. FIG. 6 is an equivalent circuit display of the CMOS inverter shown in FIG. 5. The CMOS inverter of the first cell 10a is constituted by a pMOS transistor Q1 and an nMOS transistor Q2. The first cell 10a is placed on a lower half region of the p-well $ROW_{j-2}$ and on an upper half region of the n-well region $ROW_{j-1}$ as shown in FIG. 5. In the n-well $ROW_{j-1}$, a $p^+$ source region 30a and a $p^+$ drain region 32a into which an acceptor impurity (p-type impurity) element such as boron (B) and indium (In) is doped are provided. In the p-well $ROW_{j-2}$, an $n^+$ source region 31a and an $n^+$ drain region 35a into which a donor impurity (n-type impurity) element such as phosphorous (P), arsenic (As) and antimony (Sb) is doped are provided. Element isolation regions 38 formed by a shallow trench isolation method (STI method) or the like are provided around a $P^+$ diffusion region 30a and an $n^+$ diffusion region 30b, whereby the pMOS transistor Q1 and the nMOS transistor Q2 are isolated from each other. In the first cell 10a, a gate electrode 36a made of poly-silicon or the like and common to the pMOS transistor Q1 and the nMOS transistor Q2 is place in the column direction (channel width direction) to span both regions of the p-well $ROW_{j-2}$ and the n-well $ROW_{j-1}$. In the $p^+$ source region 30a and the $p^+$ drain region 32a of the pMOS transistor Q1 formed in the first cell 10a, a local wire (source electrode) 33b connected to the high-level power supply wire VDD through a via 62 and a local wire (drain electrode) 39a shared by the nMOS transistor Q2 are placed, respectively. In the $n^+$ source region 31a and the $n^+$ drain region 35a of the nMOS transistor Q2 formed in the first cell 10a, a local wire (source electrode) 33a connected to the low-level power supply wire VSS through the via 62 and a local wire (drain electrode) 39a are provided, respectively. The source electrodes 33a and 33b and the drain electrode 39a are formed of local wires made of a conductive material such as Cu and Al. Ohmic contacts are made, through contact regions 34, to the source electrodes 33a and 33b with the $n^+$ source region 31a and the $p^+$ source region 30a, respectively, and to the drain electrode 39a with the $n^+$ drain region 35a and the $p^+$ drain region 32a. As shown by arrows in FIG. 5, the possible sizes of the transistors to be placed in the first cell 10a are determined by the sizes in the column direction of the p+ diffusion region made up of the p+ source region 30a and the p+ drain region 32a, and of the n+ diffusion region made up of the n+ source region 31a and the n+ drain region 35a. In other words, the sizes of the transistors are determined by the channel widths of the $p^+$ and $n^+$ diffusion regions. The width (length in the row direction) of the first cell 10a may be varied as long as the height (length in the column direction) thereof is fixed, as shown in FIGS. 1, 3 and 4. The first cells 10b to 10k are substantially the same as the first cell 10a, and hence the description thereof will be omitted.

Figure 7:
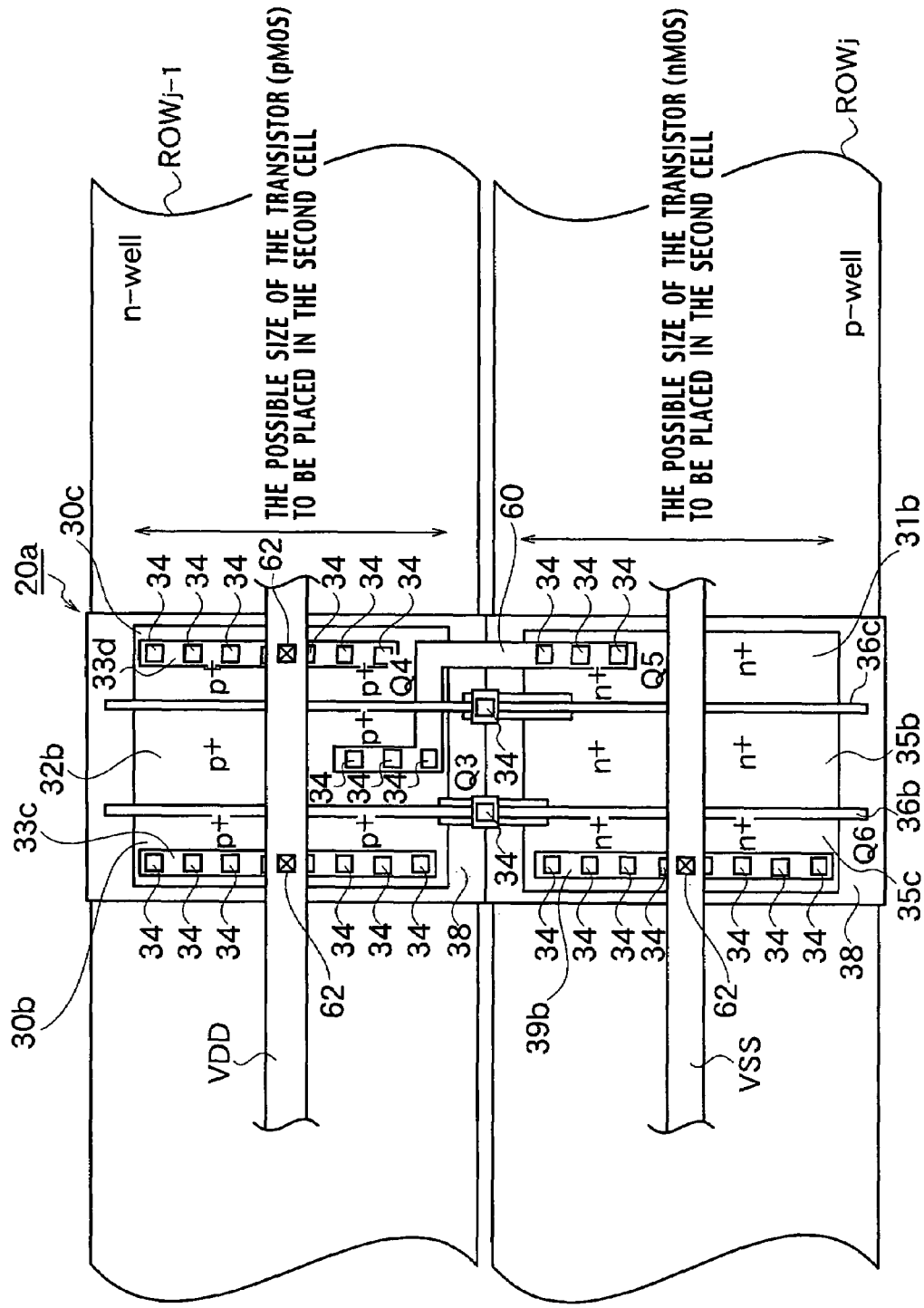
FIG. 7 is a plan view showing a second cell according to the first embodiment of the present invention.
Figure 8:
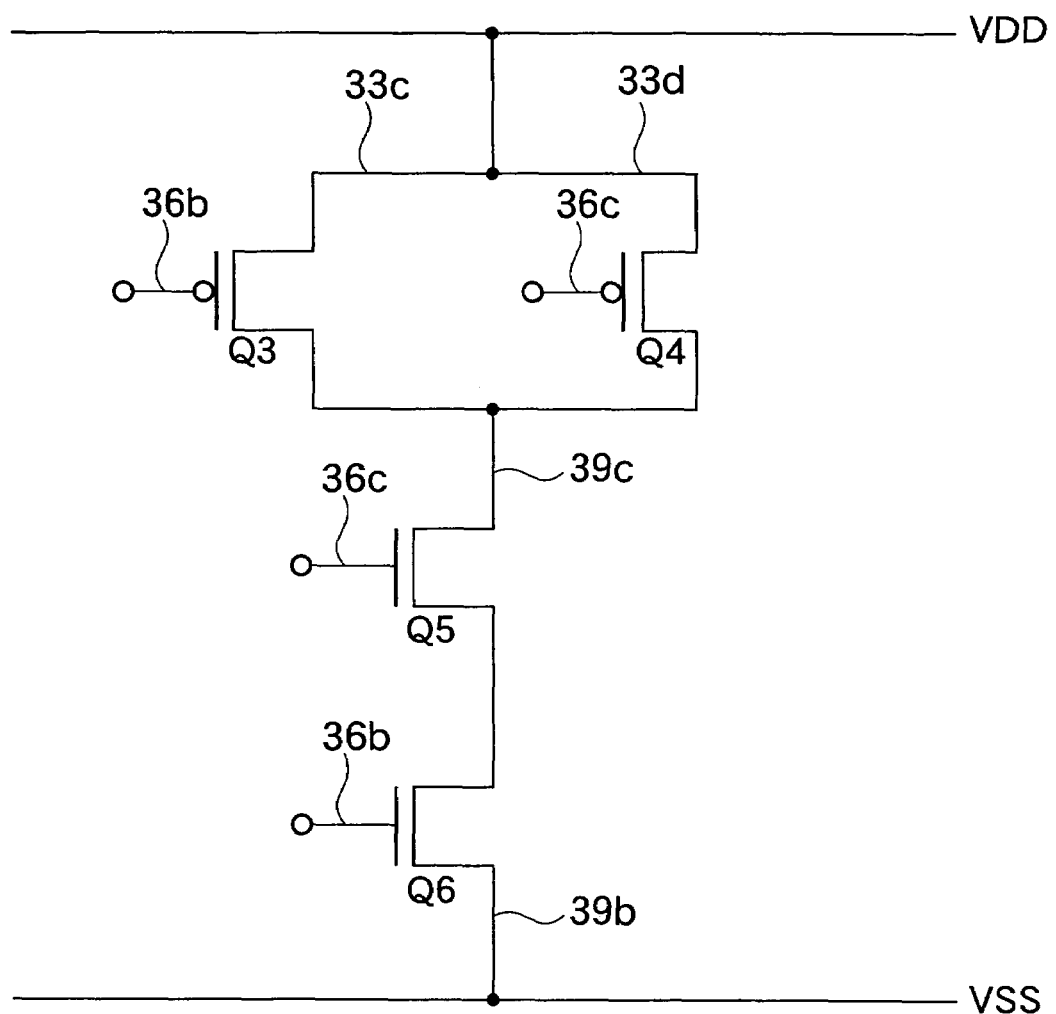
FIG. 8 is an equivalent circuit representing the second cell according to the first embodiment of the present invention.

FIG. 7 shows a two-input NAND formed by placing local wires to the second cell 20a. FIG. 8 is an equivalent circuit display of the two-input NAND of a CMOS shown in FIG. 7. The CMOS two-input NAND of the second cell 20a is constituted by: two PMOS transistors Q3 and Q4 connected in parallel to the high-level power supply wire VDD; and two nMOS transistors Q5 and Q6 connected in series between the low-level power supply wire VSS and a $p^+$ drain region 32b common to the pMOS transistors Q3 and Q4. As shown in FIG. 7, the second cell 20a is formed on the p-well $ROW_j$ and the n-well $ROW_{j-1}$. In the n-well $ROW_{j-1}$, $p^+$ source regions 30b and 30c as well as the $p^+$ drain region 32b are provided. In the p-well $ROW_j$, an $n^+$ source region 31b as well as $n^+$ drain regions 35b and 35c are provided. The element isolation regions 38 formed by the STI method or the like are provided around the $p^+$ source regions 30b and 30c, $p^+$ drain region 32b, $n^+$ source region 31b and $n^+$ drain regions 35b and 35c, whereby the pMOS transistors Q3 and Q4 are isolated from the nMOS transistors Q5 and Q6. In the column direction (channel width direction) of the second cell 20a, gate electrodes 36b and 36c made of poly-silicon or the like are placed to span both regions of the p-well $ROW_j$ and the n-well $ROW_{j-1}$. The gate electrode 36b is common to the pMOS transistor Q3 and the nMOS transistor Q6. The gate electrode 36c is common to the pMOS transistor Q4 and the nMOS transistor Q5. A local wire (source electrode) 33c is placed in the $p^+$ source region 30b of the pMOS transistor Q3 formed in the second cell 20a. A local wire (source electrode) 33d is placed in the $p^+$ source region 30c of the pMOS transistor Q4. Moreover, a local wire (source/drain electrode) 60 is placed in the $p^+$ drain region 32b common to the pMOS transistors Q3 and Q4. The source/drain electrode 60 is also used as a source electrode of the nMOS transistor Q5. In the $n^+$ source region 31b of the nMOS transistor Q5 and the $n^+$ drain region 35c of the nMOS transistor Q6 formed in the second cell 20a, the source/drain electrode 60 and a local wire (drain electrode) 39b are placed, respectively. The source electrodes 33c and 33d, drain electrode 39b and source/drain electrode 60 are formed by local wires made of a conductive material such as Cu and Al. Ohmic contacts are made, through the contact regions 34, to the source electrodes 33c and 33d with the $p^+$ source regions 30b and 30c, respectively, to the drain electrode 39b with the $n^+$ drain region 35c, and to the source/drain electrode 60 with the $p^+$ drain region 32b and the $n^+$ source region 31b. Moreover, through the vias 62, the high-level power supply wire VDD is connected with the source electrodes 33c and 33d, and the low-level power supply wire VSS is connected with the drain electrode 39b. As shown by arrows in FIG. 7, the possible sizes of the pMOS and nMOS transistors to be placed in the second cell 20a are determined by the channel width, namely, the sizes in the column direction of the p+ diffusion region made up of the p+ source regions 30b and 30c and the p+ drain region 32b, and of the n+ diffusion region made up of the n+ source region 31b and the n+ drain regions 35b and 35c. That is, the channel width of the second cell 20a is twice as large as that of the first cell 10a. Therefore, both of large pMOS and nMOS transistors can be placed therein. The p- and n-wells of second cells have areas for disposing larger transistors than the transistors disposed in the p- and n-wells of first cells. Therefore, since the second cell 20a is capable of containing large transistors therein, the large transistors requiring a large driving current can be used as a buffer, a flip-flop, an inverter or the like. The width (length in the row direction) of the second cell 20a may be varied as long as the height (length in the column direction) thereof is fixed. The second cells 20b and 20c are substantially the same as the second cell 20a, and hence the description thereof will be omitted.

Figure 9:
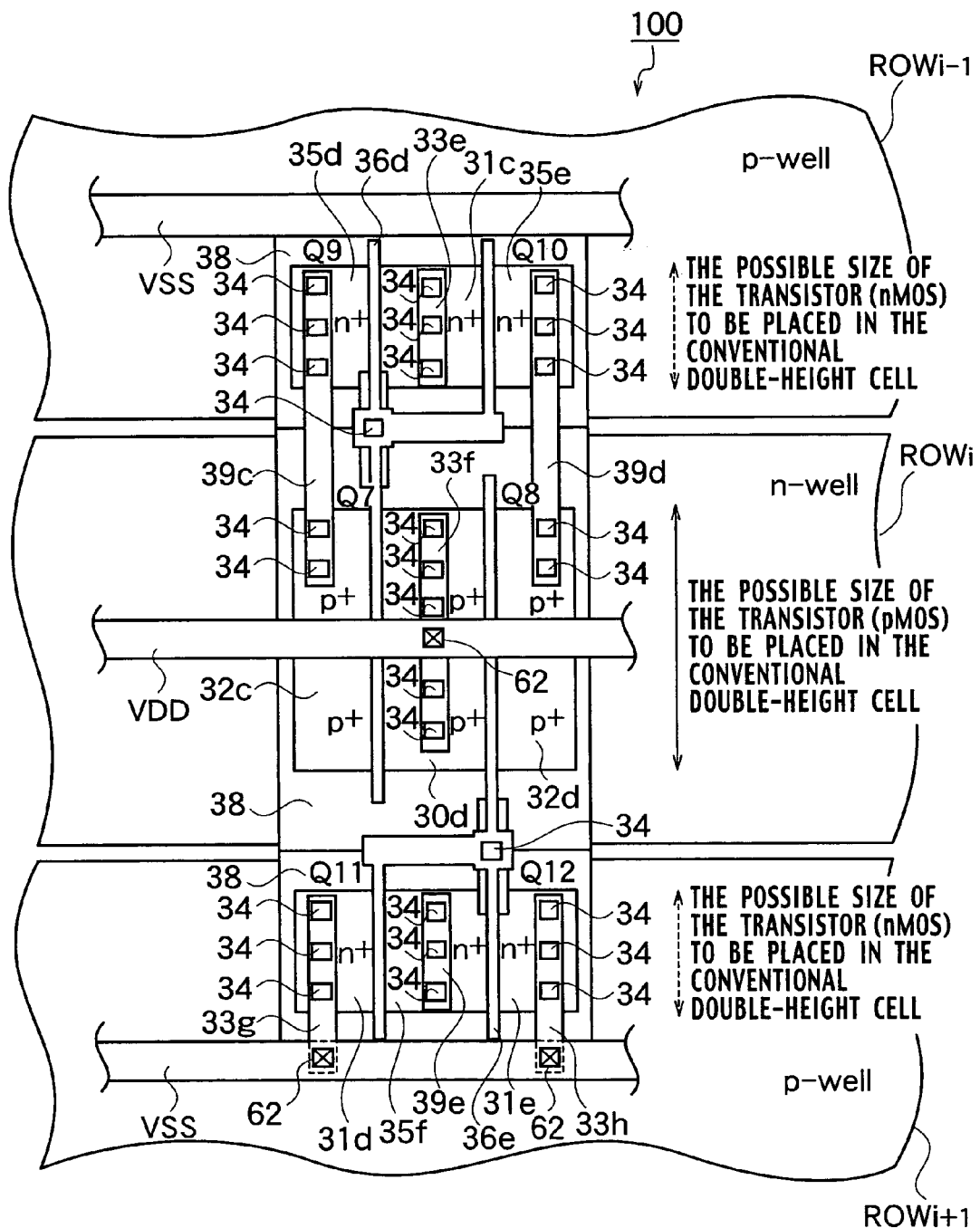
FIG. 9 is a plan view showing a earlier double-height cell as a comparison example with the second cell according to the first embodiment of the present invention.
Figure 10:
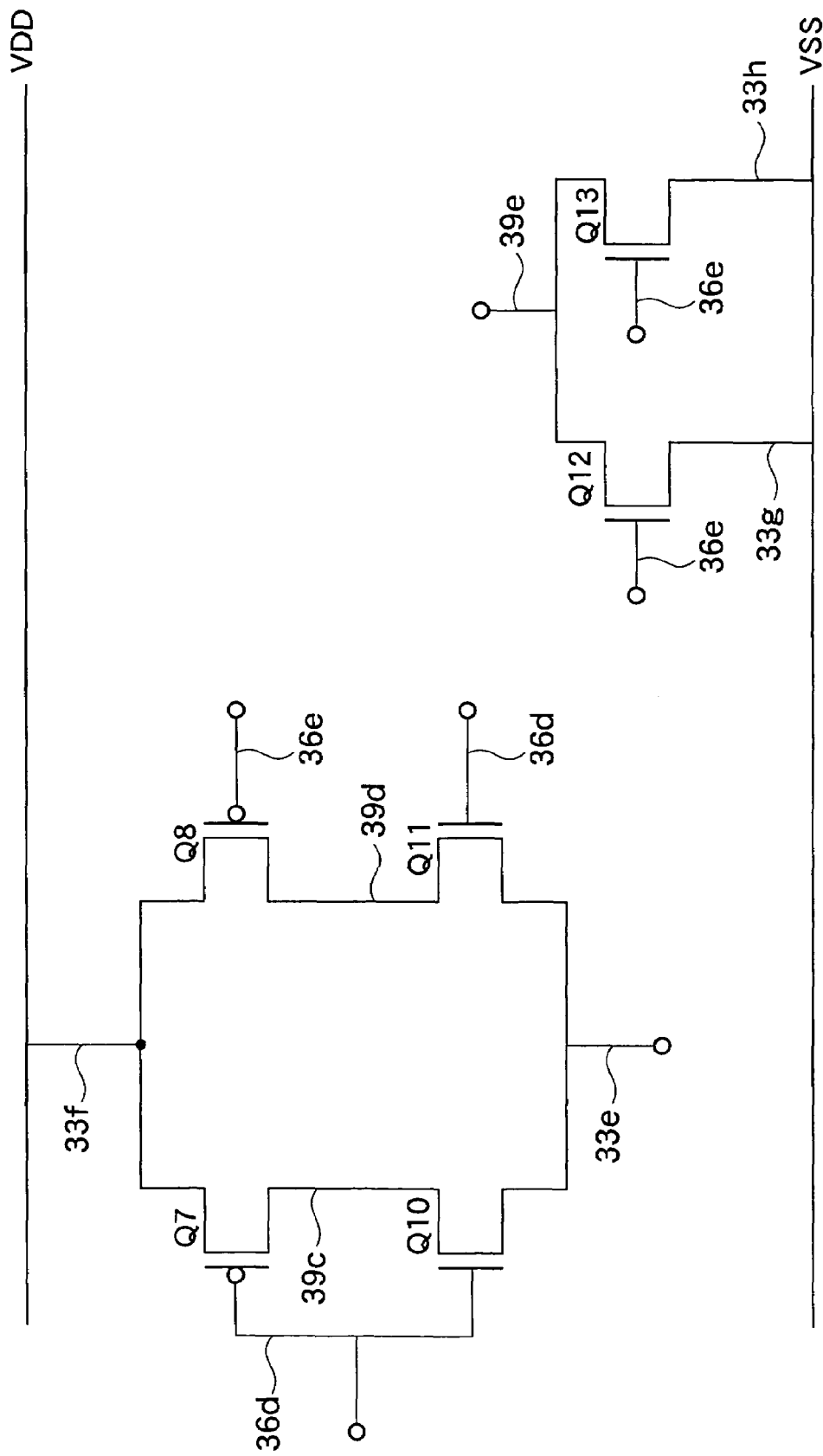
FIG. 10 is an equivalent circuit representing the earlier double-height cell as a comparison example with the second cell according to the first embodiment of the present invention.

An earlier double-height cell 100 is shown in FIG. 9 as a comparison example with the second cell 20a. FIG. 10 is an equivalent circuit display showing the earlier double-height cell 100 of FIG. 9. The earlier double-height cell 100 is constituted by two pMOS transistors Q7 and Q8 and four nMOS transistors Q9 to Q12. The earlier double-height cell 100 is, for example, formed on p-wells $ROW_{i-1}$ and $ROW_{i+1}$ and an n-well $ROW_i$, and similar to a cell in which the first cells 10a are vertically arranged. In the n-well $ROW_i$, a p$^+$ source region 30d and p$^+$ drain regions 32c and 32d are provided. In the p-well $ROW_{i-1}$, an n$^+$ source region 31c and n$^+$ drain regions 35d and 35e are placed, and in the p-well $ROW_{i+1}$, n$^+$ source regions 31d and 31e and an n$^+$ drain region 35f are placed. The element isolation regions 38 formed by the STI method or the like are provided around the p$^+$ source region 30d, p$^+$ drain regions 32c and 32d, n$^+$ source regions 31c to 31e and n$^+$ drain regions 35d to 35f, whereby the pMOS transistors Q7 and Q8 are isolated from the nMOS transistors Q9 to Q12. In the column direction (channel width direction) of the earlier double-height cell 100, a gate electrode 36d is placed to span both regions of the p-well $ROW_{i-1}$ and the n-well $ROW_i$, and a gate electrode 36e to span both regions of the p-well $ROW_{i+1}$ and the n-well $ROW_i$. The gate electrodes 36d and 36e are made of poly-silicon or the like. The gate electrode 36d is common to the pMOS transistor Q7 and the nMOS transistors Q9 and Q10. The gate electrode 36e is common to the PMOS transistor Q8 and the nMOS transistors Q11 and Q12. The low-level power supply wires VSS made of a conductive material such as Cu and Al are placed on top and bottom of the earlier double-height cell 100. Moreover, in the earlier double-height cell 100, the high-level power supply wire VDD crosses, in the row direction, in the vicinity of the center line of the p$^+$ diffusion region made up of the p$^+$ source region 30d and the p$^+$ drain regions 32c and 32d. A common local wire (source electrode) 33f is placed in the p$^+$ source region 30d of the pMOS transistors Q7 and Q8, which is formed on the n-well $ROW_i$. A common local wire (drain electrode) 39c is placed in the p$^+$ drain region 32c of the pMOS transistor Q7. The drain electrode 39c is shared with the nMOS transistor Q9. Further, a local wire (drain electrode) 39d is placed in the p$^+$ drain region 32d of the pMOS transistor Q8. The drain electrode 39d is shared with the nMOS transistor Q10. A local wire (source electrode) 33e is placed in the n$^+$ source region 31c of the nMOS transistors Q9 and Q10 formed on the p-well $ROW_{i-1}$. Further, a local wire (drain electrode) 39c is placed in the n$^+$ drain region 35d of the nMOS transistor Q9, and a local wire (drain electrode) 39d is placed in the n$^+$ drain region 35e of the nMOS transistor Q10. Local wires (source electrodes) 33g and 33h are placed in the n$^+$ source regions 31d and 31e of the nMOS transistors Q11 and Q12, respectively, the n$^+$ source regions being formed on the p-well $ROW_{i+1}$. The source electrodes 33g and 33h are connected to the low-level power supply wire VSS through the vias 62. A local wire (drain electrode) 39e is placed in the n$^+$ drain region 35f of the nMOS transistors Q11 and Q12. The source electrodes 33e to 33h and the drain electrodes 39c to 39e are formed of local wires made of a conductive material such as Cu and Al. Ohmic contacts are made, through the contact regions 34, to the source electrode 33e to 33h with the n$^+$ source region 31c, p$^+$ source region 30d, n$^+$ source region 31d, and n$^+$ source region 31e, respectively, and to the drain electrodes 39c to 39e with the n$^+$ drain region 35d and the p$^+$ drain region 32c, n$^+$ drain region 35e and p$^+$ drain region 32d, and n$^+$ drain region 35f, respectively. Moreover, the high-level power supply wire VDD is connected with the source electrode 33f through the via 62.

In the earlier double-height cell 100, as shown in FIG. 9, for example, if a large area is used for the p$^+$ diffusion region on the n-well $ROW_i$ made up of the p$^+$ source region 30d and the p$^+$ drain regions 32c and 32d, the n$^+$ diffusion region is divided into two regions. One of the divided region is made up of the n$^+$ source region 31c and n$^+$ drain regions 35d and 35e formed on the p-well $ROW_{i-1}$, and the other of the divided region is made up of the n$^+$ source regions 31d and 31e and n$^+$ drain region 35f formed on the p-well $ROW_{i+1}$. Therefore, two divided regions can provide only a small area. Accordingly, although a large pMOS transistor can be placed in the p$^+$ diffusion region within the range shown by a solid arrow in FIG. 9, only small nMOS transistors can be placed in the divided n$^+$ diffusion region within the ranges shown by dashed arrows. In other words, although a large transistor can be delineated in one well region, only a small transistor can be delineated in the other well region. When a plurality of small transistors are delineated instead of delineating one large transistor, the small transistors are overheads of wires and contacts connecting among transistors. Therefore, it is more advantageous to delineate one large transistor than to delineate a plurality of small transistors. Hence, the second cell 20a, in which a large transistor can be delineated in both the p-well and n-well regions, is preferable.

As has been described above, according to the semiconductor integrated circuit of the first embodiment, the positions of the cell borders of the first cells 10a to 10k are different from the cell borders of the second cells 20a to 20c, and thus a large continuous space is provided in both the p-well and n-well regions. Accordingly, a transistor with a large driving current can be placed in the second cells 20a to 20c. Moreover, since a large space can be provided in both of the p-well and n-well regions of the second cells 20a to 20c, greater freedom in designing a transistor can be obtained. Furthermore, the space for the filler 40 provided due to the different positions between the cell borders of the first cells 10a to 10k and the cell borders of the second cells 20a to 20c can be effectively utilized by applying a spare cell, a capacitor, a diode, a sub-fixed cell or the like thereto.

Figure 11:
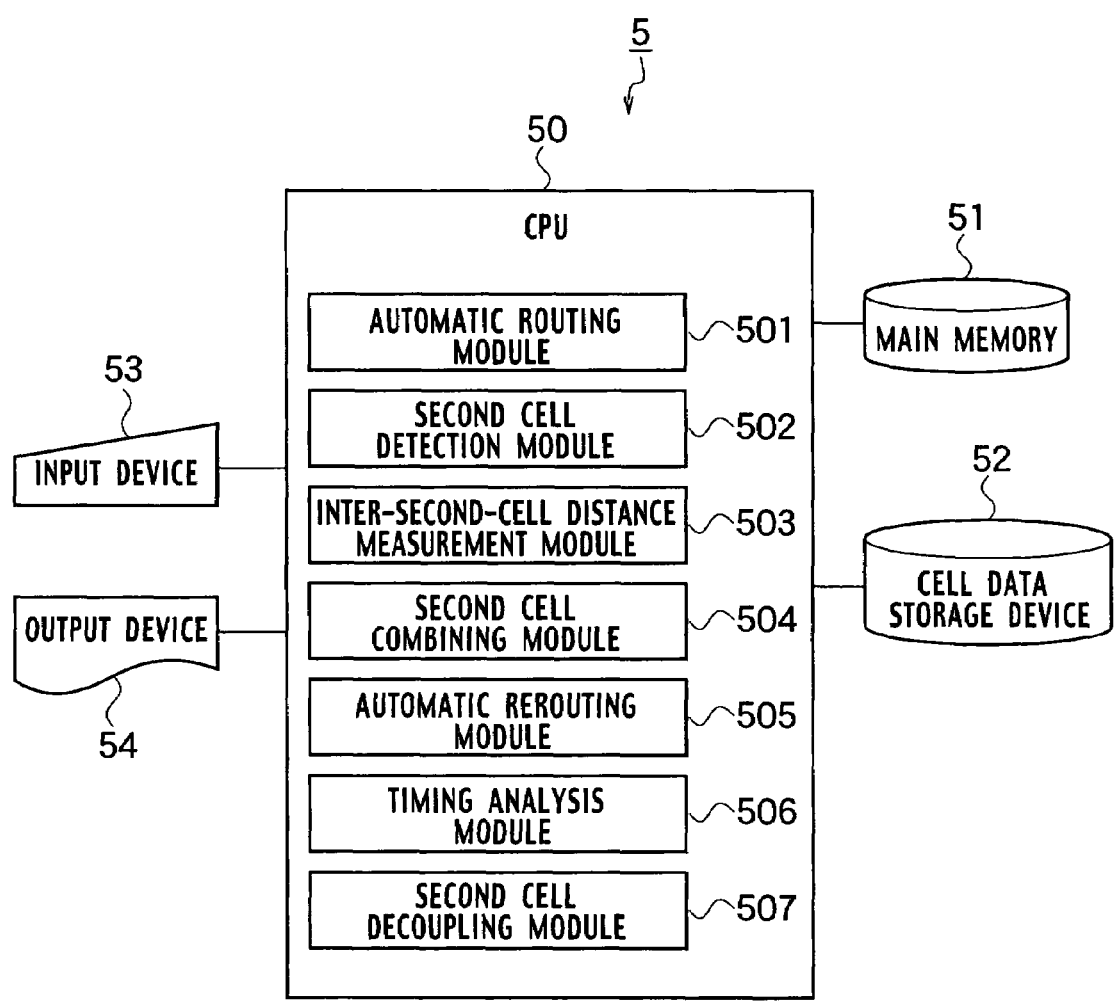
FIG. 11 is a block diagram showing a semiconductor integrated circuit design system according to the first embodiment of the present invention.

A semiconductor integrated circuit design system 5 for designing the semiconductor integrated circuit of the first embodiment includes a central processing unit (CPU) 50, a main memory 51, a cell data storage device 52, an input device 53 and an output device 54 as shown in FIG. 11. The CPU 50 includes an automatic routing module 501, a second cell detection module 502, an inter-second-cell distance measurement module 503, a second cell combining module 504, an automatic rerouting module 505, a timing analysis module 506 and a second cell decoupling module 507. Moreover, the CPU includes an unillustrated storage device managing module.

The automatic routing module 501 configures to read the first cells 10 and second cells 20 having functional circuits from the cell date storage device 52, and to place the first cells 10 and second cells 20 as appropriate so that there is no timing delay in any of the paths. Further, the automatic routing module 501 routes interconnections between the placed first cells 10 and second cells 20.

The second cell detection module 502 configures to detect the second cells 20 from among the cells positioned by the automatic routing module 501. The "second cell 20" is a cell whose height is twice the height of the first cell 10 as described above, and placed or positioned to span the p-well and the n-well adjacent to each other among the p-wells $ROW_{j-2}$, $ROW_j$ and $ROW_{j+2}$ and the n-wells $ROW_{j-1}$ and $ROW_{j+1}$ such that the own height of the second cell covers the entire widths of the p-well and the n-well measured in the column direction. Moreover, the second cell detection module 502 detects a physically isolated second cell 20 from the detected second cells 20.

The inter-second-cell distance measurement module 503 configures to measure a distance between the isolated second cell 20 detected by the second cell detection module 502 and a second cell 20 nearest to the isolated second cell 20. Moreover, the inter-second-cell distance measurement module 503 configures to determine whether the measured distance between the isolated second cell 20 and the nearest second cell 20 is shorter than a defined inter-second-cell distance decided based on the design specification.

When the distance between the isolated second cell 20 and the nearest second cell 20 measured by the inter-second-cell distance measurement module 503 is shorter than the defined inter-second-cell distance, the second cell combining module 504 configures to relocate the isolated second cell 20 so as to combine the two second cells 20 to be vertically adjacent to each other.

The automatic rerouting module 505 configures to perform automatic placement and so as to revive a logical conformity, which have been lost by the relocation of the isolated second cell 20 by the second cell combining module 504. Moreover, the automatic rerouting module 505 configures to perform automatic placement and routing again also when timing delay is clarified by timing analysis.

The timing analysis module 506 configures to perform timing analysis of the placed first cells 10 and second cells 20 of the semiconductor integrated circuit. For example, the timing analysis module 506 configures to perform timing analysis consideration of the power supply voltage, the range of temperature to be used and the like. The timing analysis is performed by modeling propagation of signals of respective logic elements constituting the circuit, and simulating operation when a logic signal (test pattern) is applied thereto. Another timing analysis is performed in which operation analysis is performed based on delay times defined for routes for signal propagation and the respective logic elements.

The second cell decoupling module 507 configures to decouple the combination of the second cells in which a timing violation occurred due to the relocation of the isolated second cell 20 by the second cell combining module 504. Here, the timing violation occurred because the delay time is increased when the wire is extended for the relocation of the second cell 20. In other words, the second cell decoupling module 507 restricts transfer of the second cell 20 placed within a second cell-to-path distance, which is a distance between the second cell 20 and the path violating the timing and is decided based on the design specification of the chip. The second cell-to-path distance may be decided by changing the distance stepwise until the timing violation is not observed.

The semiconductor integrated circuit design system 5 includes an unillustrated input/output control device (interface) for connecting the input device 53, the output device 54 and the like to the CPU 50. Moreover, a read only memory (ROM) and a random access memory (RAM) are incorporated in the main memory 51. The RAM serially stores information and the like used during the execution of a program by the CPU 50, and functions as an information memory and the like used as a work area. The cell data storage device 52 is a recording unit using a well-known magnetic tape, a magnetic drum, an optical disk, a magneto-optical disk, a semiconductor memory such as a ROM or a RAM, or the like. The cell data storage device 52 configures to store data of function and size of a plurality of the first cells 10 and the second cells 20 to be placed in the semiconductor integrated circuit. The input device 53 is constituted by a keyboard, a mouse, a voice device, a light pen and the like. A liquid crystal display (LCD), a cathode ray tube (CRT) display, a printer or the like can be used as the output device 54.

With reference to FIG. 4 and FIGS. 11 to 14, a description will be given hereinbelow of a semiconductor integrated circuit design method according to the first embodiment in which the foregoing semiconductor integrated circuit design system 5 is used.

Figure 12:
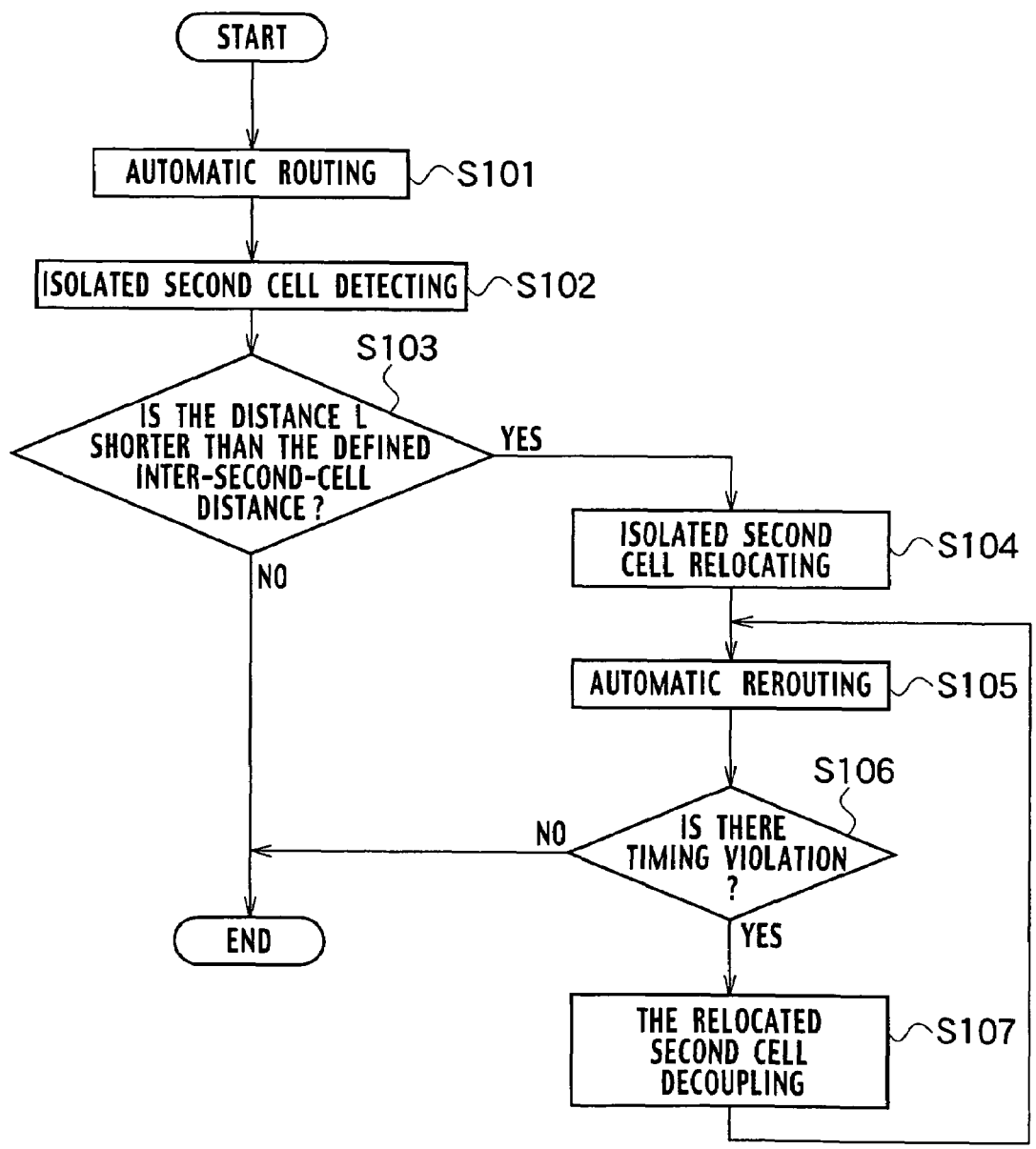
FIG. 12 is a flowchart for explaining a method for designing a semiconductor integrated circuit according to the first embodiment of the present invention.

(A) In Step S101 of FIG. 12, first cells 10 and second cells 20 having functional circuits are read from the cell data storage device 52 by the automatic routing module 501 shown in FIG. 11. Then, the read cells are placed as appropriate as shown in FIG. 4. Thereafter, the placed cells are routed interconnections between the placed cells with wires by the automatic routing module 501 such that there is no timing violation.

Figure 13:
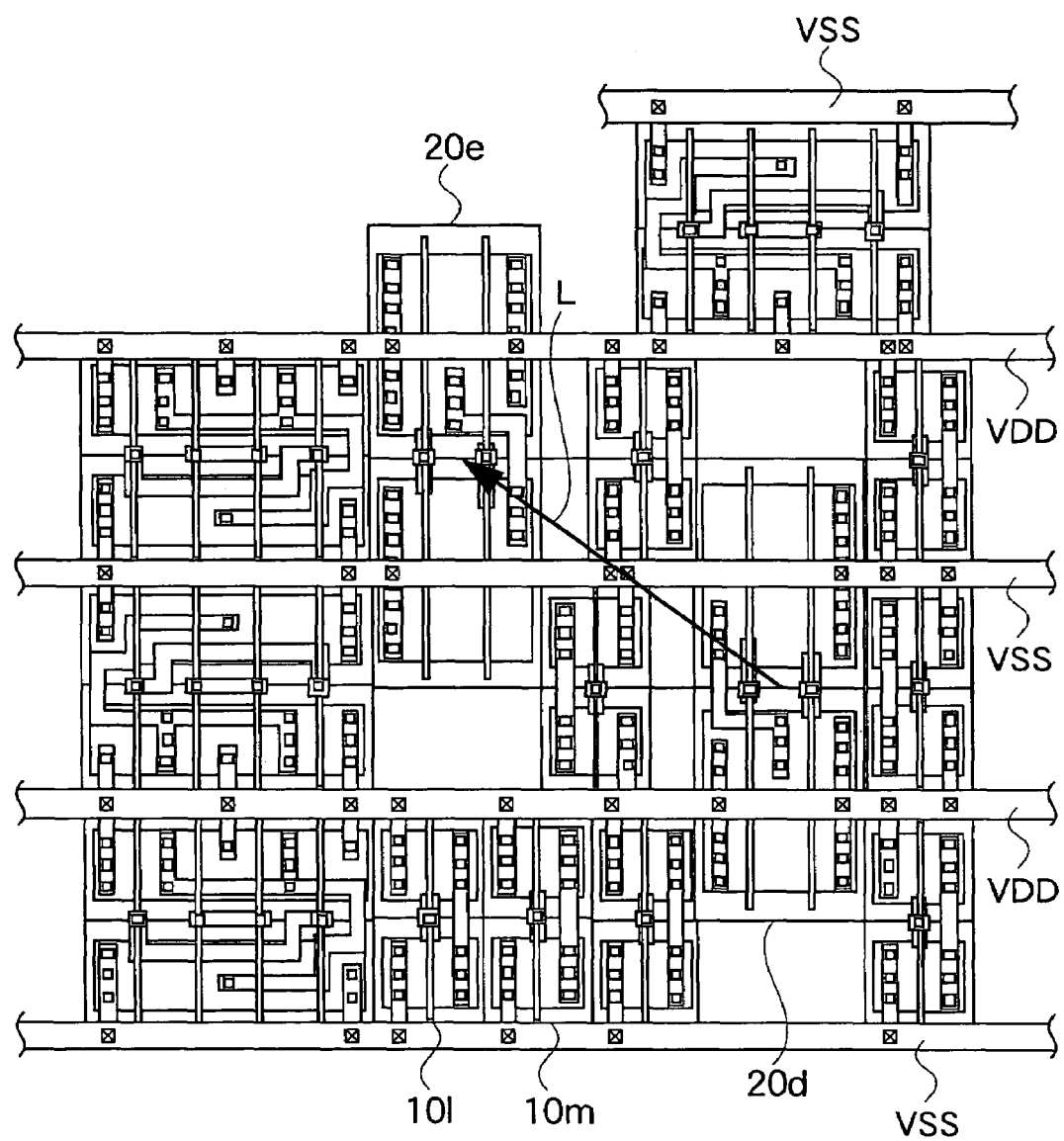
FIG. 13 is a plan view for explaining a method for designing a semiconductor integrated circuit according to the first embodiment of the present invention.

(B) In Step S102, by the second cell detection module 502 shown in FIG. 11, the second cells 20d and 20e are detected, for example, from among the cells positioned as shown in FIG. 13. Further, the second cell detection module 502 detects, from between the detected second cells 20d and 20e, the second cell 20d is physically isolated.

(C) In Step S103, for example, the distance L, shown by an arrow in FIG. 13, between the isolated second cell 20d and the second cell 20e nearest to the isolated second cell 20d, both having been detected by the second cell detection module 502, is measured by the inter-second-cell distance measurement module 503 shown in FIG. 11. Further, the inter-second-cell distance measurement module 503 determines whether the distance L is shorter than the defined inter-second-cell distance decided based on the design specification. If the distance between the isolated second cell 20d and the nearest second cell 20e is longer than the defined inter-second-cell distance, the design is finished. If the distance is shorter, the process moves to Step S104.

(D) In Step S104, the isolated second cell 20d is relocated by the second cell combining module 504 shown in FIG. 11. The two second cells 20d and 20e are then coupled to be vertically adjacent to each other.

Figure 14:
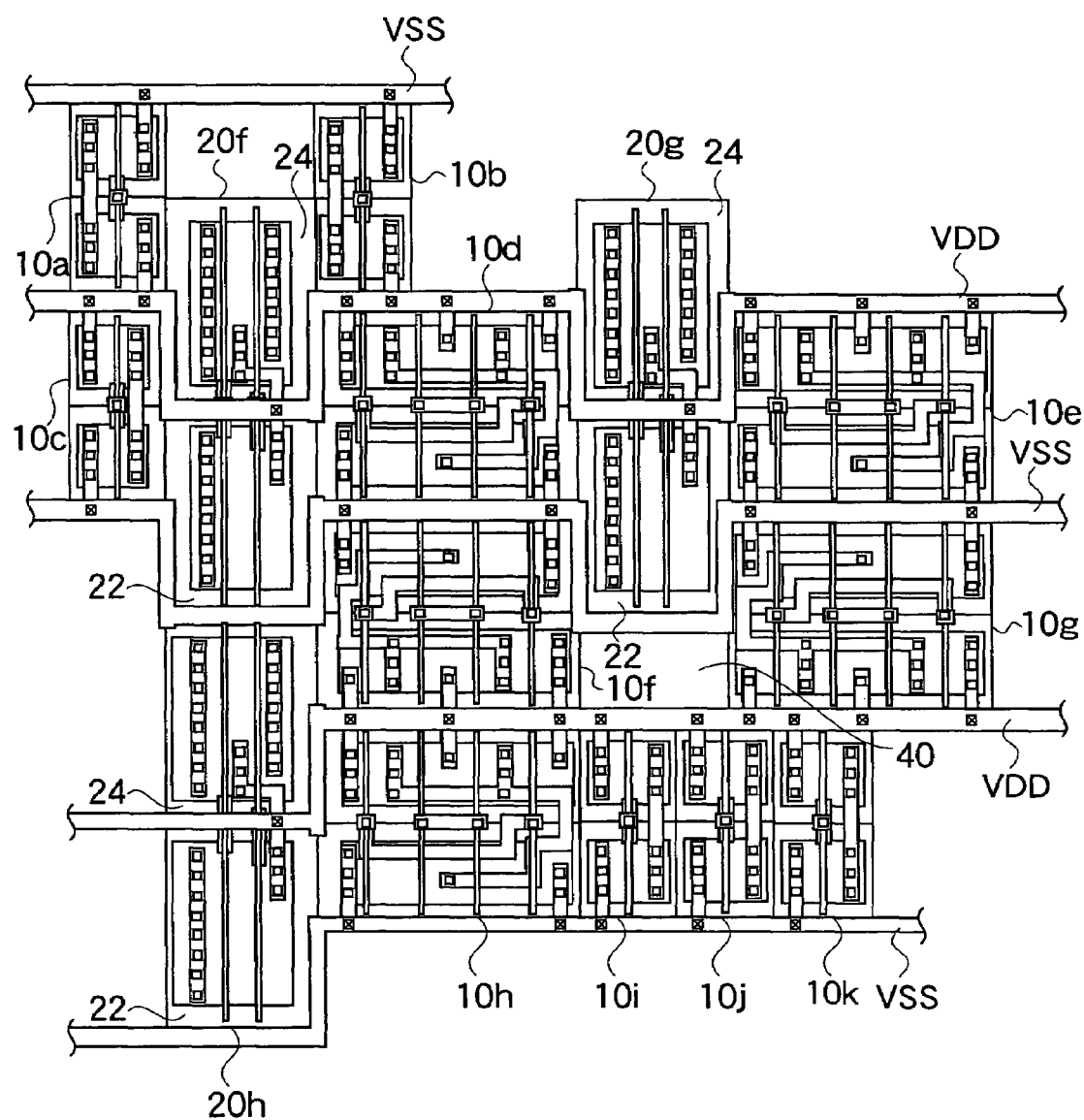
FIG. 14 is another plan view for explaining a method for designing a semiconductor integrated circuit according to the first embodiment of the present invention.

(E) In Step S105, by the rerouting module 505 shown in FIG. 11, automatic rerouting, such as moving the first cells 10l and 10m as shown in FIG. 14, is performed. Moreover, the automatic rerouting module 505 performs automatic placement and so as to revive a logical conformity, which has been lost by relocation of the isolated second cell 20d.

(F) In Step S106, by the timing analysis module 506 shown in FIG. 11, timing analysis is performed on the designed chip while the power supply voltage, the range of temperature to be used and the like are taken into consideration. If there is no timing violation in the designed chip, the design is completed. If there is a timing violation, the process moves to Step S107.

(G) In Step S107, if the relocated second cell 20d is placed within the second cell-to-path distance, which is a distance between a second cell 20 and a path violating the timing determined based on the design specification of the chip, the relocated second cell 20d is decoupled by the second cell decoupling module 507 shown in FIG. 11. After the decoupling, the process returns to Step S105 to perform automatic placement and routing again.

As described above, according to the design method of the semiconductor integrated circuit of the first embodiment, the second cells 20 are connected to be vertically adjacent to each other, whereby the number of fillers 40 can be reduced. Therefore, the limited area of the chip can be efficiently utilized.

Second Embodiment

Figure 15:
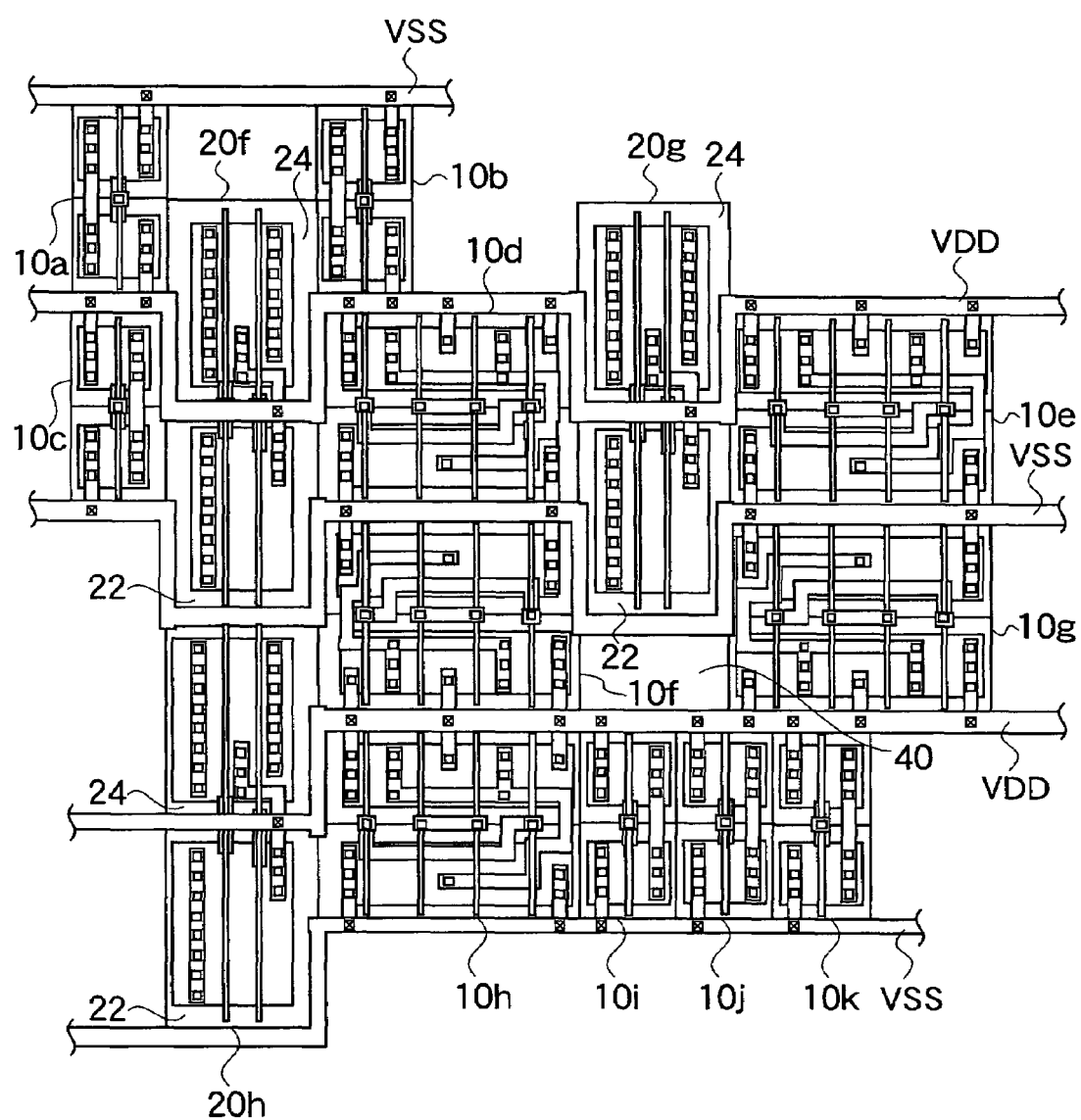
FIG. 15 is a plan view showing a semiconductor integrated circuit according to a second embodiment of the present invention.

As shown in FIG. 15, a standard cell configuration of a semiconductor integrated circuit according to a second embodiment of the present invention is different from the semiconductor integrated circuit shown in FIG. 4 in that the high-level power supply wire VDD and the low-level power supply wire VSS detour around the second cells 20f to 20h so that the power supplies VDD and VSS do not pass through the centers of the intra-cell p region 22 and the intra-cell n region 24 of the second cells 20f to 20h. The semiconductor integrated circuit of the second embodiment is otherwise substantially the same as one in shown in FIG. 4. Hence, overlapping description will be omitted.

According to the semiconductor integrated circuit of the second embodiment, the cell borders of the first cells 10a to 10k and the cell borders of the second cells 20f to 20h are positioned differently from each other. Therefore, a large space in which the respective p-well and n-well regions are continuous can be provided in the second cells 20f to 20h. Accordingly, a transistor with a large driving current can be positioned in the second cells 20f to 20h. Moreover, since a large space can be provided in both of the intra-cell p regions 22 and the intra-cell n regions 24 of the second cells 20f to 20h, greater freedom is obtained in the design of a transistor. In the semiconductor integrated circuit according to the second embodiment, the high-level power supply wire VDD and the low-level power supply wire VSS detour around the intra-cell p region 22 and the intra-cell n region 24 of the second cells 20f to 20h, whereby greater freedom is possible for placement of a transistor. Furthermore, the filler 40 formed by positioning the cell borders of the first cells 10a to 10k differently from the cell borders of the second cells 20f to 20h can be efficiently utilized by employing a spare cell, a capacitor, a diode, a sub-fixed cell or the like.

OTHER EMBODIMENTS

The present invention has heretofore been described based on the embodiments. However, the descriptions and the delinatings, which are a part of the disclosure, should not be understood as limiting the invention. Various substitutions, examples and operative technologies will be made clear from this disclosure to those skilled in the art.

Figure 16:
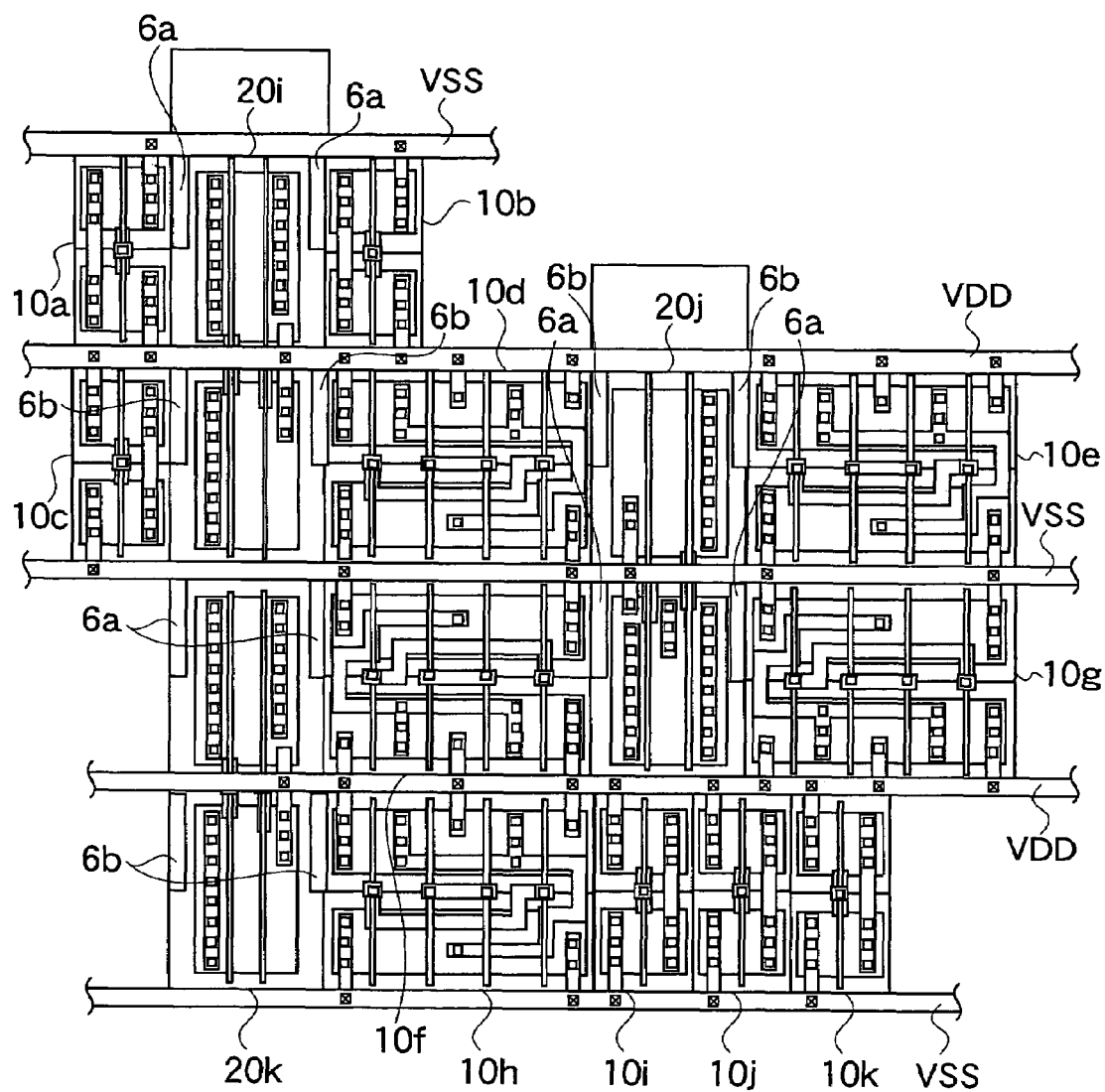
FIG. 16 is a plan view showing a semiconductor integrated circuit according to other embodiment of the present invention.

In the first embodiment, a large space continuous in both the p-well and the n-well regions is provided by positioning the first cells 10a to 10k and the second cells 20a to 20c which are in positions different from each other in the channel width direction, while the positions of the well regions are not changed. However, as shown in FIG. 16, the second cells may be second cells 20i to 20k in which a large space continuous in both the p-well and n-well regions is provided by changing the borders of the well regions. Nevertheless, in the case of changing the border of the well region, the well borders need adjusting. Accordingly, to adjust the well borders, p-well region overlap widths 6a are placed in the n-well regions of the second cells 20i to 20k, and n-well overlap widths 6b are placed in the p-well regions of the second cells 20i to 20k.

Moreover, although the high-level power supply wire VDD is described as a wiring layer perpendicular to the local wires in the first and second embodiments, a metal wire may be provided in an upper layer. By providing a metal wire in an upper layer, transistors can be freely placed in the p-well and n-well regions without constraints from the high-level power supply wire.

Various modifications will become possible for those skilled in the art after receiving the teachings of the present disclosure without departing from the scope thereof.

What is claimed is:

1. A semiconductor integrated circuit including a plurality of standard cells implemented by p-wells and n-wells, extending along the row direction, the row of the p-wells and n-wells are arranged periodically and alternately along the column direction, comprising:
   a first cell spanning one of the p-wells and one of the n-wells adjacent to each other, and having one end on a dividing line inside the p-well and another end on a dividing line inside the n-well, and having a height determined by the one end and the another end; and
   a second cell, spanning another one of the p-wells and another one of the n-wells adjacent to each other, with a height covering the entire widths of the p- and n-wells measured along the column direction, wherein the height of the second cell is double that of the first cell, and one end and another end of the second cell is different from a position of a cell border in the row direction of the first cell in the column direction, and
   wherein a same row is included in the first cell and the second cell.

2. The semiconductor integrated circuit of claim 1, further comprising one of low- and high-level power supply wires extending along the row direction in the vicinity of the center line of the row of the p-wells.

3. The semiconductor integrated circuit of claim 1, further comprising one of low- and high-level power supply wires extending along the row direction in the vicinity of the center line of the row of the n-wells.

4. The semiconductor integrated circuit of claim 1, wherein the high-level power supply wire detours around the second cell.

5. The semiconductor integrated circuit of claim 1, wherein the low-level power supply wire detours around the second cell.

6. The semiconductor integrated circuit of claim 1, wherein the one end and the another end of the first cell is different from a position of a cell border in the row direction of the second cell by half of the height of the first cell in the column direction.

7. The semiconductor integrated circuit of claim 1, further comprising a filler provided in an empty space generated by a gap of heights between the first and second cells.

8. The semiconductor integrated circuit of claim 1, wherein the first cell includes a functional circuit.

9. The semiconductor integrated circuit of claim 1, wherein the second cell includes a functional circuit.

10. The semiconductor integrated circuit of claim 1, wherein the p-and n-wells of the second cells have areas for disposing larger transistors than the transistors disposed in the p- and n-wells of the first cells.

11. The semiconductor integrated circuit of claim 1, wherein a width in the row direction of the first cell is freely determined.

12. The semiconductor integrated circuit of claim 1, wherein a width in the row direction of the second cell is freely determined.

* * * * *